United States Patent
Mori et al.

(10) Patent No.: US 11,624,128 B2
(45) Date of Patent: Apr. 11, 2023

(54) GROUP III NITRIDE CRYSTAL, GROUP III NITRIDE SUBSTRATE, AND METHOD OF MANUFACTURING GROUP III NITRIDE CRYSTAL

(71) Applicant: Panasonic Corporation, Osaka (JP)

(72) Inventors: Yusuke Mori, Osaka (JP); Masashi Yoshimura, Osaka (JP); Masayuki Imanishi, Osaka (JP); Akira Kitamoto, Osaka (JP); Tomoaki Sumi, Osaka (JP); Junichi Takino, Osaka (JP); Yoshio Okayama, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 17/340,401

(22) Filed: Jun. 7, 2021

(65) Prior Publication Data
US 2021/0388528 A1 Dec. 16, 2021

(30) Foreign Application Priority Data

Jun. 12, 2020 (JP) .............................. JP2020-102594

(51) Int. Cl.
| | | |
|---|---|---|
| *C30B 29/38* | (2006.01) | |
| *C30B 25/02* | (2006.01) | |
| *C01B 21/06* | (2006.01) | |
| *C30B 29/40* | (2006.01) | |
| *H01L 21/02* | (2006.01) | |

(52) U.S. Cl.
CPC .............. *C30B 29/38* (2013.01); *C01B 21/06* (2013.01); *C30B 25/02* (2013.01); *C30B 29/403* (2013.01); *C30B 29/406* (2013.01); *C01B 21/0635* (2013.01); *H01L 21/0254* (2013.01); *H01L 21/02389* (2013.01); *H01L 21/02576* (2013.01); *H01L 21/02645* (2013.01)

(58) Field of Classification Search
CPC ..... C30B 29/38; C30B 29/406; C30B 29/403; C01B 21/0635
See application file for complete search history.

(56) References Cited

U.S. PATENT DOCUMENTS

| | | | |
|---|---|---|---|
| 8,507,364 B2 * | 8/2013 | Nagai ................... | C30B 29/403 257/E31.007 |
| 2002/0011599 A1 | 1/2002 | Motoki et al. | |
| 2016/0268129 A1 | 9/2016 | Mori et al. | |

FOREIGN PATENT DOCUMENTS

| | | |
|---|---|---|
| JP | 2000-44400 | 2/2000 |
| JP | 2003-277182 | 10/2003 |
| WO | 2015/053341 | 4/2015 |

OTHER PUBLICATIONS

Takehiro Yoshida et al., "Ultrahigh-speed growth of GaN by hydride vapor phase epitaxy", Physics Status Solidi C No. 8, No. 7-8, pp. 2110-2112, 2011.
S. Pimputkar et al., "Free electron concentration dependent sub-bandgap optical absorption characterization of bulk GaN crystals", Journal of Crystal Growth, 432, pp. 49-53, 2015.
Robert Kucharski et al., "Transparency of Semi-Insulating, n-Type, and p-Type Ammonothermal GaN Substrates in the Near-Infrared, Mid-Infrared, and THz Spectral Range", Crystals, 7, 187, 2017.

* cited by examiner

*Primary Examiner* — C Melissa Koslow
(74) *Attorney, Agent, or Firm* — Wenderoth, Lind & Ponack, L.L.P.

(57) ABSTRACT

A group III nitride crystal, wherein the group III nitride crystal is doped with an N-type dopant and a germanium element, the concentration of the N-type dopant is $1 \times 10^{19}$ $cm^{-3}$ or more, and the concentration of the germanium element is nine times or more higher than the concentration of the N-type dopant.

9 Claims, 1 Drawing Sheet

GROUP III NITRIDE CRYSTAL, GROUP III NITRIDE SUBSTRATE, AND METHOD OF MANUFACTURING GROUP III NITRIDE CRYSTAL

CROSS-REFERENCE TO RELATED APPLICATIONS

This application claims a priority of Japanese Patent Application No. 2020-102594 filed on Jun. 12, 2020, the contents of which is incorporated herein by reference.

BACKGROUND

1. Technical Field

The technical field relates to a group III nitride crystal, a group III nitride substrate, and a manufacturing apparatus for a group III nitride crystal.

2. Description of the Related Art

Semiconductors having group III nitride substrates are used in fields of optical devices such as semiconductor lasers and light emitting diodes, and high-frequency or high-power electronic devices. Such semiconductors can be expected to reduce a switching loss during power conversion as compared to silicon-based devices and therefore are attracting particular attention in recent years. To produce a high-frequency or high-power electronic device, it is necessary to produce the device on a high-quality group III nitride substrate capable of suppressing crystal defects generated in a device layer. Such group III nitride substrates may be manufactured by cutting out multiple substrates from a group III nitride crystal.

Methods of manufacturing a group III nitride crystal include, for example, a hydride vapor phase epitaxy method (hereinafter also referred to as HVPE method), an ammonothermal method, a sodium flux method, and an oxide vapor phase epitaxy method (hereinafter also referred to as OVPE method).

In the HVPE method, a hydrogen halide gas is introduced onto a single group III raw material to generate a halide gas, and the generated halide gas of the group III element is used as a raw material gas for crystal growth. For example, in the case of growing a gallium nitride crystal, an HCl gas is introduced onto Ga metal to produce a gallium chloride (e.g., GaCl) gas, and the gallium chloride-containing gas is used as a group III source to perform a high-speed growth at 1 mm/h or more (see, e.g., Yoshida et al., Physics Status Solidi C No. 8, No. 7-8, 2110-2112 (2011)). In the HVPE method, it is known that a group III nitride crystal having N-type conductivity is obtained by mainly adding a silicon element, a germanium element, an oxygen element, etc. to a group III nitride crystal. For example, a gallium nitride crystal having N-type conductivity is manufactured by adding the oxygen element to the crystal by the HVPE method (see, e.g., Japanese Laid-Open Patent Publication No. 2000-44400). In the HVPE method, a concentration of impurities added to a gallium nitride crystal is reduced so as to obtain a transparent crystal having an absorption coefficient of 1 $cm^{-1}$ or less for light having an energy of less than 3.39 eV, which is the band gap of gallium nitride (see, e.g., S. Pimputkar et al., J. Cryst. Growth 432 (2015) 49-53).

In the ammonothermal method, to manufacture a gallium nitride crystal, single crystal gallium nitride is manufactured by using polycrystalline gallium nitride as a raw material in ammonia in a supercritical state (see, e.g., Japanese Laid-Open Patent Publication No. 2003-277182). In this method, impurities can be added to a manufactured crystal at a high concentration; however, in this case, the crystal may be colored yellow, brown, or black (see, e.g., R. Kucharski et al., Crystals 2017, 7, 187).

In the OVPE method, an oxide raw material gas is used to add the oxygen element to a group III nitride crystal at a high concentration so as to manufacture a crystal (see, e.g., WO 2015/053341A1). In this method, a group-III oxide gas and a nitrogen element-containing gas are reacted to manufacture the group III nitride crystal.

The group III nitride crystals manufactured by the methods as described above can be processed to obtain group III nitride substrates. From the viewpoint of production cost, it is desirable to manufacture substrates by cutting out multiple substrates from the group III nitride crystal, and it is desired to reduce a material loss during processing. As a method of processing a group III nitride substrate, for example, a non-contact processing method using a laser such as a laser slice method and a stealth dicing method may be used. In such a non-contact processing method, a material loss during substrate manufacturing can significantly be reduced as compared to machining such as a wire slice method.

However, all of the HVPE method, the ammonothermal method, the sodium flux method, and the OVPE method have a problem that when an N-type dopant is added into a group III nitride crystal to increase a carrier concentration so as to increase the conductivity of the group III nitride crystal, the crystal is colored, and the absorption coefficient is increased.

Therefore, when a group III nitride substrate is cut out and manufactured from the group III nitride crystal having the conductivity increased by containing an N-type dopant at a high concentration, light is absorbed on or near the surface of the crystal in the case of a processing method using light, which makes it difficult to process the inside. To prevent coloring of a crystal, conventionally, the concentration of the N-type dopant is adjusted, and the absorption coefficient is thereby kept at a low value in a wide wavelength region.

However, in this case, it is difficult to sufficiently improve the conductivity. Therefore, it is not easy to obtain a group III nitride crystal having both a low absorption coefficient and high conductivity.

SUMMARY

The present disclosure was conceived in view of the situations and it is therefore one non-limiting and exemplary embodiment provides a group III nitride crystal having an excellent conductivity and a low absorption coefficient.

In one general aspect, the techniques disclosed here feature: a group III nitride crystal,
wherein the group III nitride crystal is doped with an N-type dopant and a germanium element,
the concentration of the N-type dopant is $1 \times 10^{19}$ $cm^{-3}$ or more, and
the concentration of the germanium element is nine times or more higher than the concentration of the N-type dopant.

The present disclosure also provides a group III nitride substrate of an eighth aspect includes the group III nitride crystal.

The present disclosure also provides a method of manufacturing a group III nitride crystal, includes:
introducing a group III element-containing gas, a nitrogen element-containing gas, an N-type dopant-containing gas, and a germanium element-containing gas;

generating and growing a group III nitride crystal on a seed substrate by reacting the introduced group III element-containing gas, the nitrogen atom-containing gas, the N-type dopant-containing gas, and the germanium element-containing gas.

According to the present disclosure, a group III nitride crystal having an excellent conductivity and a low absorption coefficient can be obtained.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

Figure 1:
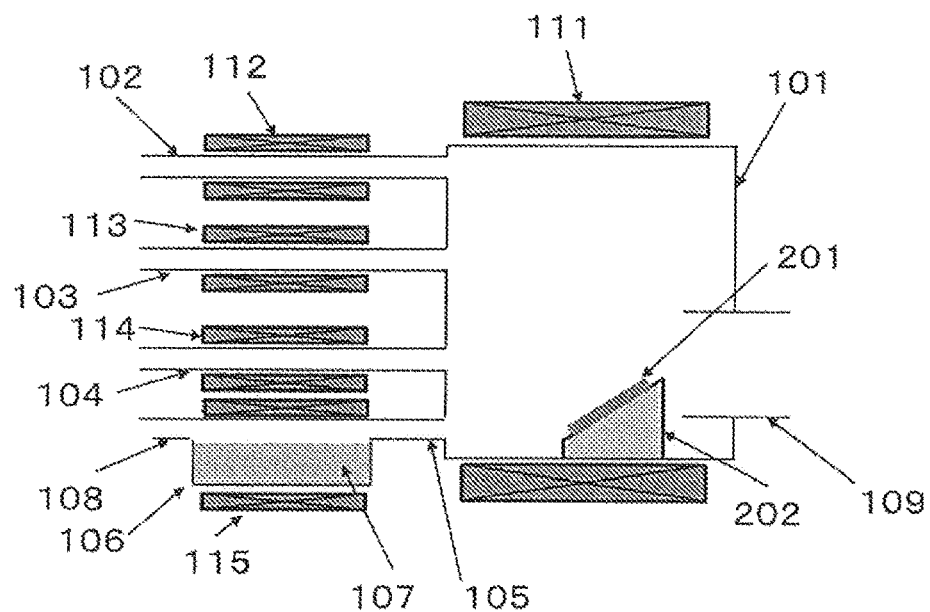
FIG. 1 is a cross-sectional view schematically showing an example of an apparatus used in a method of manufacturing a group III nitride crystal according to a first embodiment.

A group III nitride crystal according to a first aspect, wherein the group III nitride crystal is doped with an N-type dopant and a germanium element, the concentration of the N-type dopant is $1 \times 10^{19}$ cm$^{-3}$ or more, and the concentration of the germanium element is nine times or more higher than the concentration of the N-type dopant.

Further, as a group III nitride crystal of a second aspect, in the first aspect, the concentration of the N-type dopant may be $1 \times 10^{19}$ cm$^{-3}$ or more and $5 \times 10^{21}$ cm$^{-3}$ or less.

Further, as a group III nitride crystal of a third aspect, in the first aspect, the N-type dopant may contain at least one of a silicon element and an oxygen element.

Further, as a group III nitride crystal of a fourth aspect, in the third aspect, the N-type dopant may contain the oxygen element.

Further, as a group III nitride crystal of a fifth aspect, in the first aspect, the group III nitride crystal has an absorption coefficient of 60 cm$^{-1}$ or less for light having an energy of less than a band gap energy value of the group III nitride crystal.

Further, as a group III nitride crystal of a sixth aspect, in the first aspect, the group III nitride crystal has an absorption coefficient of 60 cm$^{-1}$ or less for light having an energy of less than 3.39 eV.

Further, as a group III nitride crystal of a seventh aspect, in the first aspect, the group III nitride crystal may have an electrical resistivity of 1 mΩ·cm or less.

A group III nitride substrate of an eighth aspect may include the group III nitride crystal of the first aspect.

Further, as a group III nitride substrate of a ninth aspect, in the eighth aspect, the group III nitride substrate may have a thickness of 100 μm or more.

A method of manufacturing a group III nitride crystal of tenth aspect, includes:

introducing a group III element-containing gas, a nitrogen element-containing gas, an N-type dopant-containing gas, and a germanium element-containing gas;

generating and growing a group III nitride crystal on a seed substrate by reacting the introduced group III element-containing gas, the nitrogen atom-containing gas, the N-type dopant-containing gas, and the germanium element-containing gas.

Further, as a method of manufacturing a group-III nitride crystal of eleventh aspect, in the tenth aspect, the N-type dopant-containing gas may contain at least one of a silicon element-containing gas and an oxygen element-containing gas.

Further, as a method of manufacturing a group-III nitride crystal of twelfth aspect, in the eleventh aspect, the N-type dopant-containing gas may contain the oxygen element-containing gas.

Further, as a method of manufacturing a group-III nitride crystal of thirteenth aspect, in the tenth aspect, the germanium element-containing gas may contain at least one selected from the group consisting of a germanium gas, a GeO gas, a GeH$_4$ gas, a GeH$_3$Cl gas, and a GeH$_2$Cl$_2$ gas.

Further, as a method of manufacturing a group-III nitride crystal of fourteenth aspect, in the tenth aspect, the nitrogen element-containing gas may contain at least one selected from the group consisting of an ammonia gas, a hydrazine gas, and a dimethylhydrazine gas.

Further, as a method of manufacturing a group-III nitride crystal of fifteenth aspect, in the tenth aspect, the group III element-containing gas may contain at least one of an oxide of a group III element and a halide of a group III element.

Further, as a method of manufacturing a group-III nitride crystal of sixteenth aspect, in the tenth aspect, the group III element-containing gas may contain at least one of Ga$_2$O and GaCl.

<Background to the Present Disclosure>

First, background to the present disclosure completed by the present inventors will be described.

The present inventors discovered that an absorption coefficient may significantly differ in Group III nitride crystals having the same N-type dopant concentration and the same carrier concentration, thought that the direct cause of decrease in the absorption coefficient is not an N-type dopant, and pursued the principle thereof.

The present inventors analyzed a light energy dependency of an absorption coefficient of a group III nitride crystal containing an N-type dopant at a high concentration. As a result, since the absorption coefficient left a trail exponentially decreasing from a band edge of the group III nitride crystal to the low energy side, the present inventors found a possibility that when the group III nitride crystal contains an N-type dopant at a high concentration, the increase in the absorption coefficient in a wide wavelength range is caused by a phenomenon called Urbach tail.

The phenomenon called Urbach tail is a phenomenon also seen in GaAs, which is a compound semiconductor, and in GaAs, the Urbach tail is more strongly observed as an additive concentration of a P-type dopant increases and, as a result, the absorption coefficient increases in a wide wavelength range.

The present inventors found out that the Urbach tail is proportional to the square of the ionic valence of point defects (including substitution by impurities) in the crystal contributing to the occurrence of the phenomenon, and the density of the point defects.

It is known that a vacancy defect of a group III element behaves as a trivalent P-type dopant in the group III nitride crystal. On the other hand, general N-type dopants such as the silicon element and the oxygen element are monovalent N-type dopants in the group III nitride crystal. Although the P-type dopant and the N-type dopant are different and cannot simply be compared, it is inferred from the ionic valence that the vacancy defect of the group III element is highly effective in increasing the absorption coefficient as compared to the N-type dopant.

The present inventors focused on the fact that when the concentration of the N-type dopant is high, the density of vacancy defects of the group III element may increase in the group III nitride crystal. The present inventors made a hypothesis that the N-type dopant is not a direct cause of the increase in the absorption coefficient and the increase in the absorption coefficient is caused by an increase in the density of vacancy defects of the group III element generated when the N-type dopant is added to the group III nitride crystal at a high concentration.

The present inventors then thought that if the vacancy defects of the group III element can be filled with another element, the Urbach tail phenomenon can be reduced. It is deduced that a candidate element needs to have a characteristic of having an atomic radius close to the atomic radius of the group III element. Additionally, so as not to inhibit the effect of the N-type dopant, it is important that the other element filling the vacancy defects exhibits N-type characteristics when added. Furthermore, the present inventors considered that entropy can be increased by using as the other element an element different from the constituent elements of the group III element nitride and the N-type dopant (the silicon element and the oxygen element are mainly used) in the group III nitride crystal containing the N-type dopant at a high concentration. It is inferred that by increasing the entropy, the other element is stably incorporated into the crystal and effectively functions to fill the vacancy defects of the group III element. The present inventors have found that the germanium element is particularly suitable as the other element satisfying the characteristics described above.

Since the vacancy defects are directly filled with the germanium element, it can be deduced that when the density of the vacancy defects is higher, the germanium element concentration needs to be higher. Therefore, the present inventors conceived that when the N-type dopant is contained in the group III nitride crystal at a high concentration, both a low absorption coefficient and a high conductivity can be satisfied by adding the germanium element having a certain concentration or more depending on the concentration of the N-type dopant.

Although point defects of group III elements of the group III nitride crystals can be measured by the positron pair annihilation method, this method is dangerous since the measurement is performed by using positrons generated from radioactive isotopes, and therefore, it is difficult to easily perform the measurement. Additionally, quantification of defect density requires comparison with a group III nitride crystal having an extremely low defect density; however, the crystal having an extremely low defect density is difficult to obtain, and it is therefore difficult to measure the point defects of group III elements. Due to these circumstances, the mechanism of lowering the absorption coefficient of the group III nitride crystal by the addition of the germanium element is difficult to specify and is only based on the inference by the present inventors.

A group III nitride crystal, a method of manufacturing a group III nitride crystal, and a manufacturing apparatus for a group III nitride crystal according to embodiments in the present disclosure will now be described in detail.

First Embodiment

<Group III Nitride Crystal>

A group III nitride crystal according to a first embodiment (hereinafter also referred to as a crystal X) is doped with an N-type dopant and a germanium element. The concentration of the N-type dopant in the crystal X is $1\times10^9$ cm$^{-3}$ or more. The concentration of the germanium element in the crystal X is nine times or more higher than the concentration of the N-type dopant.

The crystal X has excellent conductivity due to doping with the N-type dopant at a concentration of $1\times10^{19}$ cm$^{-3}$ or more. Therefore, a group III nitride substrate formed by using the crystal X is useful for high-frequency or high-power electronic devices etc. In addition to the N-type dopant, the crystal X is doped with the germanium element at a concentration that is nine times or more higher than the concentration of the N-type dopant. As a result, the crystal X can have a low absorption coefficient even though the N-type dopant is contained at a concentration of $1\times10^{19}$ cm$^{-3}$ or more. Therefore, the crystal X is hardly colored even though the N-type dopant is contained at a concentration of $1\times10^{19}$ cm$^{-3}$ or more. A processing method using a laser requires sufficient light to enter a processed portion of a workpiece. Therefore, in the light wavelength range used for processing, the absorption coefficient of the processed portion of the workpiece needs to be sufficiently low. For example, when a group III nitride substrate is produced from the crystal X by laser processing, laser light is hardly absorbed by the crystal X due to the low absorption coefficient of the crystal X, so that the crystal X can favorably be processed.

The N-type dopant may contain at least one of a silicon element and an oxygen element. In this case, the conductivity of the crystal X can favorably be increased.

The N-type dopant may contain the oxygen element. In this case, particularly when the crystal X is produced by the OVPE method, the oxygen element can favorably be added to the crystal X.

The concentration of the N-type dopant may be $1\times10^{19}$ cm$^{-3}$ or more and $5\times10^{21}$ cm$^{-3}$ or less. In this case, the conductivity of the crystal X can further be increased.

The concentration of the germanium element is nine times or more higher than the concentration of the N-type dopant. An upper limit of the concentration of the germanium element is not particularly limited and may be $2\times10^{22}$ cm$^{-3}$ or less, for example. In this case, the crystal X has more excellent conductivity and the crystal X can have a lower absorption coefficient, so that the coloring of the crystal X can further be prevented.

A light having an energy achieving the absorption coefficient of the crystal X of 60 cm$^{-1}$ or less may exist within a range less than the bandgap energy value of the crystal X. When a semiconductor material is processed, a light having an energy equal to or greater than the bandgap energy value of the semiconductor material is easily absorbed near the surface of the semiconductor material. Therefore, when the crystal X is processed, the processing may be performed by using a laser that outputs a light having an energy lower than the bandgap energy value of the crystal X. Particularly, since the processing is performed with the light having an energy achieving the absorption coefficient of 60 cm$^{-1}$ or less, the light for processing is hardly absorbed by the crystal X. Therefore, the crystal X can particularly favorably be processed, and a material loss can be reduced when the group III nitride substrate is manufactured from the crystal X. Additionally, since the processing is performed with the light having an energy achieving the absorption coefficient of 60 cm$^{-1}$ or less, the light used for processing easily reaches from the surface to a deep part of the crystal X even when a group III nitride substrate having, for example, a thickness of 100 μm or more is manufactured from the crystal X. Therefore, the processing can favorably be performed.

The value of the bandgap energy differs depending on a composition of the crystal X. For example, in the processing of gallium nitride, the processing can favorably be performed by using a laser that outputs a light having an energy of less than the band gap of 3.39 eV. In the processing of aluminum nitride, the processing can favorably be performed by using a laser that outputs a light having an energy of less than the band gap of 6.2 eV. A lower limit of the energy value of light used for processing is not particularly limited and may be 1 eV, for example. By using the light of 1 eV or more for processing, the laser light is hardly absorbed by a high-concentration free carrier existing in the crystal X having a high concentration of the N-type dopant, so that the laser light easily enters the inside of the crystal. In this case, the light having an energy achieving the absorption coefficient of the crystal X of 60 cm$^{-1}$ or less may exist within a range of 1 eV or more and less than the bandgap energy value of the crystal X.

The light having an energy achieving the absorption coefficient of the crystal X of 60 cm$^{-1}$ or less may exist within a range less than 3.39 eV. When the crystal X is gallium nitride, the crystal X can particularly favorably be processed by using the light having an energy achieving the absorption coefficient of 60 cm$^{-1}$ or less within a range of 1 eV or more and less than 3.39 eV. The light having an energy achieving the absorption coefficient of the crystal X of 60 cm$^{-1}$ or less may exist within the range of 1 eV or more and less than 3.39 eV.

The electrical resistivity of the crystal X may be 1 mΩ·cm or less. In this case, the group III nitride substrate produced by using the crystal X can have excellent conductivity. The electrical resistivity of the crystal X is, for example, 0.7 mΩ·cm or less.

By processing the crystal X, the group III nitride substrate can be obtained. Therefore, the group III nitride substrate according to the present disclosure contains the crystal X. The thickness of the group III nitride substrate may be 100 μm or more. In this case, the group III nitride substrate has higher strength.

<Method of Manufacturing Group III Nitride Crystal>

A method of manufacturing the crystal X (group III nitride crystal) will be described with reference to FIG. 1. Although the crystal X is manufactured by using a gas in the example described below, the crystal X of the present disclosure can be obtained even when manufactured in a solution or a melt.

The method of manufacturing the crystal X includes a step of introducing a raw material gas and a step of generating and growing the crystal X. At the step of introducing the raw material gas, a group III element-containing gas, a nitrogen element-containing gas, an N-type dopant-containing gas, and a germanium element-containing gas are introduced. At the step of generating and growing the crystal X, the introduced group III element-containing gas, the nitrogen element-containing gas, the N-type dopant-containing gas, and the germanium element-containing gas are reacted to generate and grow the crystal X on a seed substrate 201 disposed on a substrate tray 202.

Four different types of gas may be used as the raw material gas, or three or less types of gas may be used. Specifically, the group III element-containing gas, the nitrogen element-containing gas, the N-type dopant-containing gas, and the germanium element-containing gas may be different from each other or may be the same. For example, the same gas may be used as the nitrogen element-containing gas and the germanium element-containing gas. The same gas may be used as the group III element-containing gas and the N-type dopant-containing gas.

In the method of manufacturing a group III nitride crystal according to the first embodiment, the group III element-containing gas may contain at least one of an oxide of the group III element and a halide of the group III element. In this case, the gas concentration of the group III element-containing gas can be kept high. Additionally, the growth rate of the crystal X can be increased. When gallium nitride is manufactured, the group III element-containing gas particularly may contain at least one of Ga$_2$O and GaCl.

In the manufacturing method of this embodiment, when a group III element oxide gas or a group III element halide gas is used as the group III element-containing gas, the method may further includes a step of generating the group III element-containing gas by reacting a group III element-containing material with a gas. In this case, it becomes easy to prevent the gas from becoming unstable in an environment that is not high temperature, causing a solid to precipitate, and making it difficult to control supply of the gas. The step of generating the group III element-containing gas may include at least one of the steps of reacting the group III element-containing material with an oxidizing gas or a halide gas and reducing a solid oxide of the group III element with a hydrogen gas to generate an oxide gas of the group III element.

The oxidizing gas may contain at least one of water vapor and an oxygen gas. The halide gas may contain HCl.

Examples of the reaction between the group III element-containing material and the oxidizing gas include, for example,

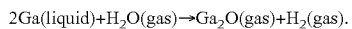

Examples of the reaction between the group III element-containing material and the halide gas include, for example,

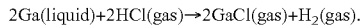

Examples of the reaction between the solid oxide of the group III element and the hydrogen gas include, for example,

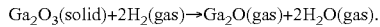

<Nitrogen Element-Containing Gas>

In the method of manufacturing a group III nitride crystal according to this embodiment, the nitrogen element-containing gas may contain at least one selected from the group consisting of an ammonia gas, a hydrazine gas, and a dimethylhydrazine gas. The ammonia gas, the hydrazine gas, and the dimethylhydrazine gas have a boiling point of 200° C. or less, can therefore more easily be supplied into a reaction vessel in a gaseous state, and have higher reactivity. Therefore, the crystal X can more favorably be grown.

<N-Type Dopant-Containing Gas>

In the method of manufacturing a group III nitride crystal according to this embodiment, the N-type dopant-containing gas may contain at least one of a silicon element-containing gas and an oxygen element-containing gas. In this case, the gas can easily be supplied into a reaction vessel in a gaseous state at room temperature, and the reactivity is excellent, so that the crystal X can favorably be grown. The N-type dopant-containing gas may contain the oxygen element-containing gas.

<Silicon Element-Containing Gas>

The silicon element-containing gas may contain at least one selected from the group consisting of $SiH_4$, $SiH_3Cl$, and $SiH_2Cl_2$. In this case, the silicon element-containing gas in a gaseous state can easily be supplied at room temperature into a reaction vessel, and the reactivity is high, so that the crystal X can favorably be grown.

<Oxygen Element-Containing Gas>

The oxygen element-containing gas may contain at least one selected from the group consisting of water vapor, oxygen gas, $N_2O$ gas, NO gas, $NO_2$ gas, CO gas, and $CO_2$ gas. In this case, the oxygen element-containing gas in a gaseous state can easily be supplied at room temperature into a reaction vessel, and the reactivity is high, so that the crystal X can favorably be grown.

The N-type dopant-containing gas particularly may contain at least one selected from the group consisting of GeO gas, $Ga_2O$ gas, and $In_2O$ gas. In this case, the N-type dopant-containing gas can easily be generated at a temperature near the manufacturing temperature of the crystal X, and the reactivity is high, so that the crystal X can favorably be grown.

<Germanium Element-Containing Gas>

The germanium element-containing gas may contain at least one selected from the group consisting of $GeH_4$, $GeH_3Cl$, and $GeH_2Cl_2$. In this case, the germanium element-containing gas in a gaseous state can easily be supplied at room temperature into a reaction vessel, and the reactivity is high, so that the crystal X can favorably be grown.

In the method of manufacturing a group III nitride crystal according to this embodiment, respective different gases or the same types of gases may be used as the group III element-containing gas, the nitrogen element-containing gas, the N-type dopant-containing gas, the germanium element-containing gas, and the carrier gas. For example, $Ga_2O$ gas may be used as the group III element-containing gas, and $Ga_2O$ may be used as the N-type dopant-containing gas. When the same type of gas is used in this way, gas introduction routes can be integrated, and manufacturing equipment can be simplified in some cases.

In the method of manufacturing a group III nitride crystal according to this embodiment, the temperature of the reaction between the group III element-containing gas and the nitrogen element-containing gas at the growing step of growing the crystal X may be 700° C. or higher and 1500° C. or lower from the viewpoint of the reactivity of the gas used for manufacturing. The temperature is, for example, 1000° C. or higher and 1400° C. or lower from the viewpoint of ensuring a crystal growth rate and improving a crystal quality.

The method of manufacturing a group III nitride crystal according to this embodiment can be performed, for example, by using a manufacturing apparatus for a group III nitride crystal shown in FIG. 1. The manufacturing apparatus for a group III nitride crystal shown in FIG. 1 is merely an example, and an apparatus capable of manufacturing the crystal X of the present disclosure is not limited to the manufacturing apparatus shown in FIG. 1. In FIG. 1, sizes and ratios of portions may differ from the actual sizes and ratios for easy understanding. FIG. 1 may include a material required to be disposed in the manufacturing apparatus in advance at the time of manufacturing of the crystal X.

<Manufacturing Apparatus for Group III Nitride Crystal>

This manufacturing apparatus for a group III nitride crystal includes a germanium element-containing gas introduction pipe 102, an N-type dopant-containing gas introduction pipe 103, a nitrogen element-containing gas introduction pipe 104, a group III element-containing gas introduction pipe 105, and a gas exhaust pipe 109 connected to a reaction vessel 101. A seed substrate 201 is placed on a substrate tray 202 disposed inside the reaction vessel. The arrangement of the germanium element-containing gas introduction pipe 102, the N-type dopant-containing gas introduction pipe 103, the nitrogen element-containing gas introduction pipe 104, and the group III element-containing gas introduction pipe 105 is not limited to that shown in FIG. 1.

As described above, four different types of gas may be used as the raw material gas, or three or less types of gas may be used. Therefore, although the manufacturing apparatus shown in FIG. 1 is provided with the four introduction pipes, which are the germanium element-containing gas introduction pipe 102, the N-type dopant-containing gas introduction pipe 103, the nitrogen element-containing gas introduction pipe 104, and the group III element-containing gas introduction pipe 105, the present disclosure is not limited thereto, and the manufacturing apparatus may have three or less introduction pipes.

The group III element-containing gas reacts with the nitrogen element-containing gas, and the crystal X grows on the seed substrate 201. Unreacted and by-product gases are discharged from the gas exhaust pipe 109.

The group III element-containing gas is generated in a group III element-containing gas generating part 106 by reacting a group III element-containing material 107 with a group III element-containing gas generation gas introduced from a group III element-containing gas generation gas introduction pipe 108.

The introduction pipes or reaction parts of the gases may be heated by heaters and adjusted so as to achieve the desired reaction states of the gasses or the growth conditions of the crystal X. For example, as shown in FIG. 1, the manufacturing apparatus may be provided with at least one of a reaction vessel heater 111 adjacent to the reaction vessel 101, a germanium element-containing gas introduction pipe heater 112 adjacent to the germanium element-containing gas introduction pipe 102, an N-type dopant-containing gas introduction pipe heater 113 adjacent to the N-type dopant-containing gas introduction pipe 103, a nitrogen element-containing gas introduction pipe heater 114 adjacent to the nitrogen element-containing gas introduction pipe 104, and a group III element-containing gas generating part heater 115 adjacent to the group III element-containing gas generating part 106.

<Group III Element-Containing Material>

The group III element-containing material 107 is a material containing at least one selected from the group consisting of aluminum (Al), gallium (Ga), indium (In), and thallium (Tl). From the viewpoint of handling at the time of placement, a material in a solid or liquid state at room temperature may be used as the group III element-containing material 107. For example, examples of the group III element-containing material 107 solid at room temperature include $Al_2O_3$, $Ga_2O_3$, $In_2O_3$, $Tl_2O_3$, Al, In, and Tl. Examples of the group III element-containing material 107 liquid at room temperature include Ga.

Examples of the gas introduced into the group III element-containing gas generating part 106 to generate the group III element-containing gas include a hydrogen gas, a water vapor gas, and a hydrogen chloride gas. The gas introduced into the group III element-containing gas generating part 106 may be mixed and introduced with the carrier gas from the viewpoint of reaction control.

<Carrier Gas>

Although the carrier gas is not particularly limited, examples of the carrier gas include a nitrogen gas, a hydrogen gas, an argon gas, and a helium gas. A gas acquired by mixing these gases may be used as the carrier gas.

<Seed Substrate>

The material of the seed substrate 201 is not particularly limited and can appropriately be selected in accordance with the characteristics of the crystal X to be manufactured. For example, it is desirable that the seed substrate 201 is a single crystal substrate having the same element composition ratio as the crystal X to be manufactured. Examples of the material of the seed substrate 201 include sapphire, $ScAlMgO_4$, group III nitride, $LiAlO_2$, and ZnO.

The present disclosure is not limited to the embodiments. For example, the constituent elements described above may arbitrarily be combined, or another embodiment achieved by excluding some of the constituent elements described above may be considered as an embodiment of the present disclosure.

EXAMPLES

A method of manufacturing a group III nitride crystal according to Example and Comparative Examples 1 and 2 will be described.

In Example, a gallium nitride crystal was manufactured as the group III nitride crystal by using gas. A $Ga_2O$ gas was used as the group III element-containing gas and the N-type dopant-containing gas, an ammonia gas was used as the nitrogen element-containing gas, and an ammonia gas was used as the germanium element-containing gas. Ga was used as the group III element-containing material, and an oxygen gas was used as the group III element-containing gas generation gas. A gallium nitride crystal was used as the seed substrate 201.

First, Ga was placed in the group III element-containing gas generating part 106, and $Ga_2O$ was generated by using the oxygen gas. The generated $Ga_2O$ was supplied from the group III element-containing gas introduction pipe 105 to the reaction vessel 101. The ammonia gas was introduced as the nitrogen element-containing gas from the nitrogen element-containing gas introduction pipe 104 into the reaction vessel 101. The Geo gas was introduced as the germanium element-containing gas from the germanium element-containing gas introduction pipe 102 into the reaction vessel 101 to manufacture the group III nitride crystal.

The manufacturing conditions for the group III nitride crystal will be described in detail. First, the heaters (111, 112, 113, 114, 115) were heated. After the temperature of the group III element-containing gas generating part 106 reached 1100° C. and the temperature of the reaction vessel reached 1200° C., the oxygen gas was introduced into the group III element-containing gas generating part 106 at a flow rate of 9 sccm, and a mixed gas of nitrogen and hydrogen was introduced as the carrier gas at the same time at a flow rate of 300 sccm and reacted on Ga placed in the group III element-containing gas generating part 106 to generate a $Ga_2O$ gas, and the obtained $Ga_2O$ gas was introduced as the group III element-containing gas and the N-type dopant-containing gas into the reaction vessel 101. The ammonia gas serving as the nitrogen element-containing gas was introduced at a flow rate of 200 sccm, the ammonia gas serving as the germanium element-containing gas was introduced at a flow rate of 5 sccm, and the mixed gas of nitrogen and hydrogen was introduced as the carrier gas thereof at a flow rate of 4 sccm, into the reaction vessel 101. In the reaction vessel 101, the $Ga_2O$ gas and the ammonia gas reacted with each other to generate a gallium nitride crystal on the seed substrate 201. The gallium nitride crystal generation reaction was performed for 5 hours. In this way, a gallium nitride crystal having a thickness of 300 μm was manufactured as an epitaxial layer on the GaN substrate.

The gallium nitride crystal of Comparative Example 1 was manufactured as in Example 1 except that the flow rate of the GeO gas serving as the germanium element-containing gas was 1 sccm.

The crystals produced in Example and Comparative Examples 1 and 2 were each polished to a thickness of 150 μm to manufacture a free-standing gallium nitride substrate composed only of a crystal layer.

By using the substrates of Example and Comparative Examples 1 and 2 obtained in this way, characteristics shown in Table 1 were evaluated. Regarding the absorption coefficient, a minimum value of the absorption coefficient was measured with respect to the absorption coefficient for light having an energy within a range equal to or less than the band gap energy of 3.39 eV of gallium nitride.

TABLE 1

| | Example | Comparative Example 1 | Comparative Example 2 |
|---|---|---|---|
| oxygen concentration (atoms/cm³) | $1.1 \times 10^{19}$ | $2.1 \times 10^{20}$ | $3.0 \times 10^{20}$ |
| germanium concentration (atoms/cm³) | $1.0 \times 10^{20}$ | $9.5 \times 10^{19}$ | $<8.0 \times 10^{16}$ |
| minimum value of absorption coefficient (cm⁻¹) | 52 | 75 | 93 |
| resistivity (mΩ · cm) | $5.84 \times 10^{-4}$ | $1.07 \times 10^{-3}$ | $1.11 \times 10^{-3}$ |

As a result of analysis of concentration of impurities in the gallium nitride crystal manufactured in Example by SIMS, the concentration of the oxygen element was $1.1 \times 10^{19}$ atoms/cm³, and the concentration of the germanium element was $1.0 \times 10^{20}$ atoms/cm³. The concentration of the germanium element was higher than the concentration of the oxygen element of the N-type dopant and was nine times or more higher than the concentration of the N-type dopant. The resistivity was $5.84 \times 10^{-4}$ Ω·cm, and the minimum value of the absorption coefficient was the absorption coefficient of 52 cm⁻¹ for the light having an energy of 1.48 eV. In Example, the concentrations of the oxygen element and the germanium element were high, the resistivity was low, and the absorption coefficient was small.

As a result of analyzing the concentration of impurities in the gallium nitride crystal manufactured in Comparative Example 1 by SIMS, the concentration of the oxygen element was $2.1 \times 10^{20}$ atoms/cm³, and the concentration of the germanium element was $9.5 \times 10^{19}$ atoms/cm³. The concentration of the germanium element had a lower value as compared to the concentration of the oxygen element of the N-type dopant. The resistivity was $1.07 \times 10^{-3}$ Ω·cm, and the minimum value of the absorption coefficient was the absorption coefficient of 75 cm⁻¹ for the light having an energy of 1.23 eV.

As a result of analyzing the concentration of impurities in the gallium nitride crystal manufactured in Comparative Example 2 by SIMS, the concentration of the oxygen element was $3.0\times10^{20}$ atoms/cm$^3$, and the concentration of the germanium element was less than the detection limit of $8.0\times10^{16}$ atoms/cm$^3$. The resistivity was $1.11\times10^{-3}$ Ω·cm, and the minimum value of the absorption coefficient was the absorption coefficient of 93 cm$^{-1}$ for the light having an energy of 1.23 eV.

As shown in Table 1, it can be seen that all the group III nitride crystals manufactured in Example and Comparative Examples 1 and 2 have a high oxygen element concentration of $1\times10^{19}$ atoms/cm$^3$ or more, and therefore have a low resistivity of about 1 mΩ·cm. For the crystal of Example having a germanium element concentration of $1\times10^{20}$ atoms/cm$^3$ or more, a light having an energy achieving an absorption coefficient of 60 cm$^{-1}$ or less exists within a range less than the band gap energy value. On the other hand, in Comparative Examples 1 and 2, the minimum value of the absorption coefficient is 75 cm$^{-1}$ and 93 cm$^{-1}$ within the range less than the bandgap energy value. Therefore, it can be seen that the absorption coefficient is reduced in the crystal of Example as compared to the crystals of Comparative Examples 1 and 2.

Figure 2:
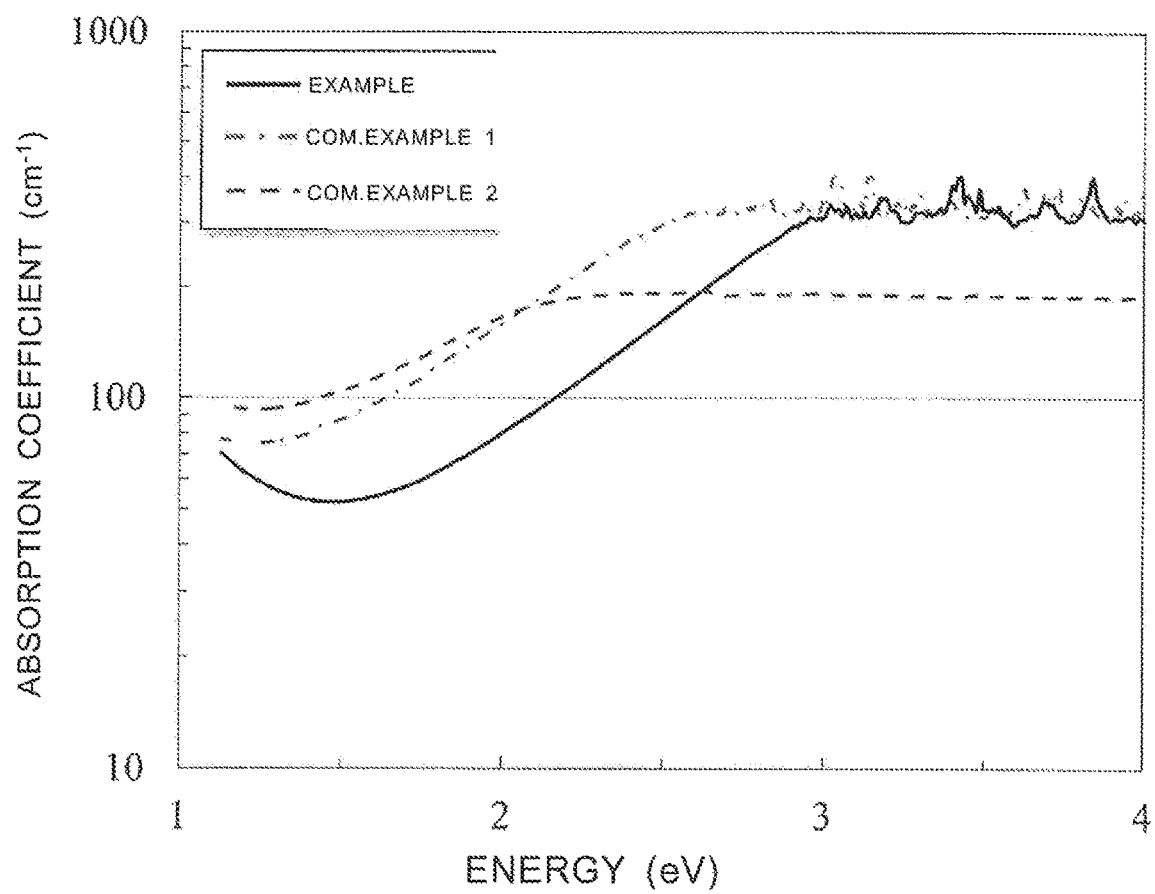
FIG. 2 is a graph showing absorption coefficients of group III nitride crystals manufactured in Examples and Comparative Example.

The absorption coefficients of the group III nitride crystals manufactured in Example and Comparative Examples 1 and 2 are shown in a graph of FIG. 2. FIG. 2 shows a relationship between an energy value of light and an absorption coefficient for the light. As shown in FIG. 2, in Example, in which the concentration of the germanium element in the crystal is nine times or more higher than the concentration of the N-type dopant, the absorption coefficient has a low value in a wide range in an energy region smaller than the band edge energy of 3.39 eV, and a light with an energy achieving 60 cm$^{-1}$ or less exists.

From the above results, in the group III nitride crystal of the present disclosure, even when the concentration of the N-type dopant in the crystal is increased so as to reduce the electrical resistivity, the absorption coefficient can be reduced in a wide energy region by containing the germanium element in the crystal at a specific concentration or more. Therefore, the inside of the crystal can be processed by using a laser.

The present disclosure includes appropriately combining any embodiments and/or examples out of the various embodiments and/or examples described above, and the effects of the respective embodiments and/or examples can be produced.

As described above, according to the group III nitride crystal, the method of manufacturing a group III nitride crystal, and the manufacturing apparatus for a group III nitride crystal according to the present disclosure, the group III element nitride crystal having a high conductivity can be processed with less material loss to produce a group III nitride semiconductor substrate, so that higher performance and lower costs of high-frequency or high-power electronic devices can be expected.

EXPLANATIONS OF LETTERS OR NUMERALS 101 reaction vessel
102 germanium element-containing gas introduction pipe
103 N-type dopant-containing gas introduction pipe
104 nitrogen element-containing gas introduction pipe
105 group III element-containing gas introduction pipe
106 group III element-containing gas generating part
107 group III element-containing material
108 group III element-containing gas generation gas introduction pipe
109 gas exhaust pipe
111 reaction vessel heater
112 germanium element-containing gas introduction pipe heater
113 N-type dopant-containing gas introduction pipe heater
114 nitrogen element-containing gas introduction pipe heater
115 group III element-containing gas generating part heater
201 seed substrate
202 substrate tray

What is claimed is:

1. A group III nitride crystal,
wherein the group III nitride crystal is doped with an N-type dopant and a germanium element,
the concentration of the N-type dopant is $1\times10^{19}$ cm$^{-3}$ or more, and
the concentration of the germanium element is nine times or more higher than the concentration of the N-type dopant.

2. The group III nitride crystal according to claim 1, wherein the concentration of the N-type dopant is $1\times10^{19}$ cm$^{-3}$ or more and $5\times10^{21}$ cm$^{-3}$ or less.

3. The group III nitride crystal according to claim 1, wherein the N-type dopant contains at least one of a silicon element and an oxygen element.

4. The group III nitride crystal according to claim 3, wherein the N-type dopant contains the oxygen element.

5. The group III nitride crystal according to claim 1, wherein the group III nitride crystal has an absorption coefficient of 60 cm$^{-1}$ or less for light having an energy of less than a band gap energy value of the group III nitride crystal.

6. The group III nitride crystal according to claim 1, wherein the group III nitride crystal has an absorption coefficient of 60 cm$^{-1}$ or less for light having an energy of less than 3.39 eV.

7. The group III nitride crystal according to claim 1, wherein the group III nitride crystal has an electrical resistivity of 1 mΩ·cm or less.

8. A group III nitride substrate including the group III nitride crystal according to claim 1.

9. The group III nitride substrate according to claim 8, wherein the group III nitride crystal has a thickness of 100 µm or more.

* * * * *